United States Patent
Wood et al.

(10) Patent No.: US 9,047,211 B2
(45) Date of Patent: Jun. 2, 2015

(54) MANAGING DATA RELIABILITY

(71) Applicant: Fusion-io, Inc., Salt Lake City, UT (US)

(72) Inventors: Robert Wood, Niwot, CO (US); David Flynn, Sandy, UT (US)

(73) Assignee: SanDisk Technologies, Inc., Plano, TX (US)

( * ) Notice: Subject to any disclaimer, the term of this patent is extended or adjusted under 35 U.S.C. 154(b) by 113 days.

(21) Appl. No.: 13/836,620

(22) Filed: Mar. 15, 2013

(65) Prior Publication Data

US 2014/0281819 A1  Sep. 18, 2014

(51) Int. Cl.
| | |
|---|---|
| G11C 29/00 | (2006.01) |
| G06F 11/10 | (2006.01) |
| G11C 16/34 | (2006.01) |
| G11C 16/00 | (2006.01) |
| G11C 29/04 | (2006.01) |

(52) U.S. Cl.
CPC ............ *G06F 11/1048* (2013.01); *G11C 16/00* (2013.01); *G11C 16/349* (2013.01); *G11C 2029/0409* (2013.01); *G11C 2029/0411* (2013.01)

(58) Field of Classification Search
CPC ............ G06F 12/0246; G06F 2212/1032; G06F 11/1068; G06F 11/1072; G06F 2212/7202; G11C 16/00; G11C 16/349; G11C 2029/0409
USPC .......... 711/173; 370/230.1; 709/227; 386/83, 386/292; 714/704, 769, 763, 774
See application file for complete search history.

(56) References Cited

U.S. PATENT DOCUMENTS

| | | | |
|---|---|---|---|
| 5,787,490 A * | 7/1998 | Ozawa .......................... | 711/173 |
| 6,466,476 B1 | 10/2002 | Wong et al. | |
| 6,643,169 B2 | 11/2003 | Rudelic et al. | |
| 7,120,051 B2 | 10/2006 | Gorobets et al. | |
| 7,301,805 B2 | 11/2007 | Gorobets et al. | |
| 7,460,476 B1 * | 12/2008 | Morris et al. .............. | 370/230.1 |
| 7,499,320 B2 | 3/2009 | Li | |
| 7,502,255 B2 | 3/2009 | Li | |
| 7,801,109 B2 * | 9/2010 | Miyagawa et al. ........... | 370/350 |
| 7,925,936 B1 | 4/2011 | Sommer | |
| 8,055,979 B2 | 11/2011 | Wu et al. | |
| 2008/0177881 A1 * | 7/2008 | Endebrock et al. ........... | 709/227 |
| 2009/0257733 A1 * | 10/2009 | Ellis ................................ | 386/83 |
| 2011/0209028 A1 | 8/2011 | Post et al. | |
| 2012/0301116 A1 * | 11/2012 | Ellis ................................ | 386/292 |

FOREIGN PATENT DOCUMENTS

WO  2007132457  11/2007

OTHER PUBLICATIONS

Li, Shu, "Improving Multi-Level NAND Flash Memory Storage Reliability Using Concatenated BCH-TCM Coding", IEEE Transactions on Very Large Scale Integration (VLSI) Systems, Oct. 2010, pp. 9, vol. 18, No. 10.

* cited by examiner

*Primary Examiner* — David Ton
(74) *Attorney, Agent, or Firm* — Kunzler Law Group, PC

(57) ABSTRACT

An apparatus, system, and method are disclosed for managing data reliability. A priority module is configured to receive a storage request for a non-volatile memory device. The storage request may include data associated with a priority. The non-volatile memory device includes a plurality of cells, and each cell encodes a plurality of bits. The bits for a cell provide distinct levels of quality of service. A select module is configured to select a bit for storing the data based on the priority of the data and the level of quality of service of the selected bit. A data management module is configured to manage the data to satisfy a write order for the plurality of bits.

24 Claims, 9 Drawing Sheets

MANAGING DATA RELIABILITY

TECHNICAL FIELD

The present disclosure, in various embodiments, relates to data storage and more particularly relates to managing the reliability of data stored in memory cells with multiple states.

BACKGROUND

Several types of data storage devices, such as Flash memory, store data in arrays of cells. A physical property of each cell, such as a stored charge, material phase, electrical resistance, magnetization, or the like, is alterable to encode data. The range of possible values for the physical property is divided into discrete states, so that each state encodes a possible data value. For example, a cell with two states may encode a "0" or a "1," corresponding to one binary digit, or bit, of information.

Higher storage densities may be achieved by dividing the range of possible values for each cell into more than two states. For example, a cell with four states may encode two bits of information, and a cell with eight states may encode three bits of information. However, adding states to a cell may decrease a size of each state, thus increasing the probability that an error will occur where a stored value of the cell drifts from one state to an adjacent state. Also, if a cell encodes multiple bits, one bit in the cell may be more prone to errors than another bit in the same cell, depending on the arrangement of the states and on the encoding that is used.

SUMMARY

Methods are presented for managing data reliability. In one embodiment, a method includes receiving a storage request for a non-volatile recording device. In a further embodiment, the storage request may include data having a priority designation. In certain embodiments, the non-volatile recording device includes a plurality of cells. In further embodiments, each cell includes a plurality of states and a transition guard band between first and second adjacent states. In some embodiments, the plurality of states are configured to represent values for a plurality of bits. In a further embodiment, the transition guard band is configured such that bits for a cell provide distinct levels of quality of service. In some embodiments, a method includes selecting a bit for storing the data based on the priority of the data and the level of quality of service of the selected bit. In certain embodiments, a method includes managing the data to satisfy a write order for the plurality of bits.

Apparatuses are presented for managing data reliability. In one embodiment, a priority module is configured to receive a storage request for a non-volatile memory device. In a certain embodiment, the storage request may include data associated with a priority. In a further embodiment, the non-volatile memory device includes a plurality of cells, and each cell encodes a plurality of bits. In certain embodiments, the bits for a cell have different error rates. In some embodiments, a select module is configured to select a bit for storing the data based on the priority of the data and the error rate of the selected bit. In further embodiments, a data management module is configured to queue write operations for programming the data in order to satisfy a write order for the plurality of bits.

In one embodiment, an apparatus includes means for determining a priority for data of a non-volatile storage device. In certain embodiments, the non-volatile storage device includes a plurality of cells, and each cell encodes a plurality of bits. In further embodiments, the bits for a cell provide distinct performance levels. In some embodiments, an apparatus includes means for selecting a bit of the plurality of cells for storing the data based on the priority of the data and the performance level of the selected bit. In one embodiment, an apparatus includes means for programming the data to the selected bit to provide the performance level of the selected bit to the data.

Systems are presented for managing data reliability. In one embodiment, a non-volatile recording device is in communication with a host device over a communications bus. In a further embodiment, the non-volatile recording device includes a plurality of cells, and each cell encodes a plurality of bits. In certain embodiments, the bits for a cell provide distinct levels of quality of service. In one embodiment, a priority module is configured to determine a priority for data of the non-volatile recording device. In some embodiments, a select module is configured to select a bit for storing the data based on the priority of the data and the level of quality of service of the selected bit. In further embodiments, an error correcting code ("ECC") module is configured to use error information determined in response to reading the data from the selected bit to read additional data. In a certain embodiment, the additional data is stored by one or more non-selected bits.

Computer program products are presented to perform operations for managing data reliability. In some embodiments, a computer program product includes a computer readable storage medium storing computer usable program code executable to perform the operations of the computer program product. In one embodiment, operations include determining a priority for data of a non-volatile memory device. In a further embodiment, the non-volatile memory device includes a plurality of cells, and each cell encodes a plurality of bits. In a certain embodiment, the bits for a cell provide distinct levels of quality of service. In another embodiment, the priority for the data is determined based on a virtual storage unit selected by a client from a plurality of virtual storage units for storing the data. In some embodiments, operations include selecting a bit for storing the data based on the priority of the data and the level of quality of service of the selected bit. In further embodiments, operations include programming the data to the selected bit to provide the level of quality of service of the selected bit to the data.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings, in which.

DETAILED DESCRIPTION

Figure 1A:
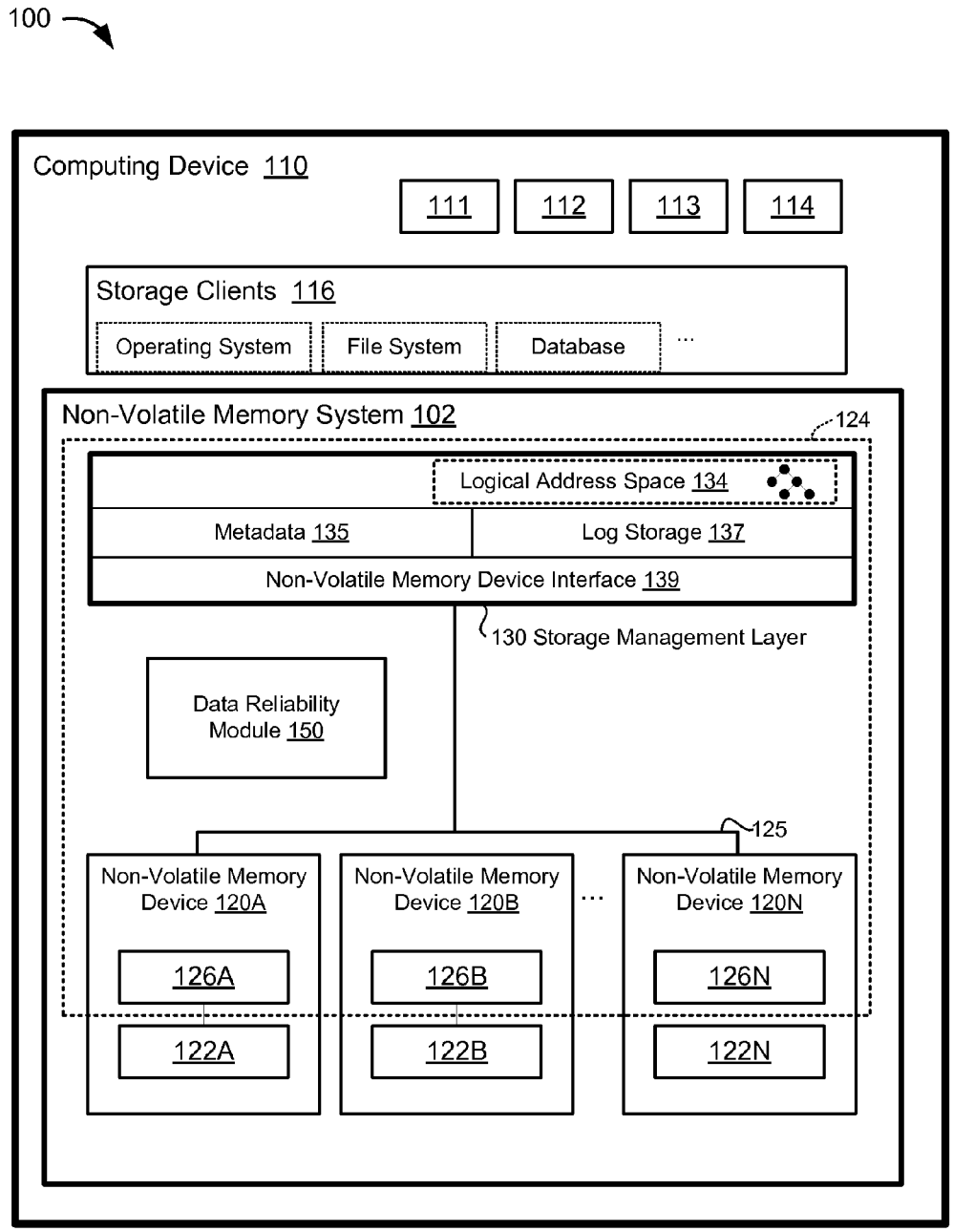
FIG. 1A is a schematic block diagram of one embodiment of a non-volatile memory system comprising a data reliability module.

Aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable storage media having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable storage media.

Any combination of one or more computer readable storage media may be utilized. A computer readable storage medium may be, for example, but not limited to, an electronic, magnetic, optical, electromagnetic, infrared, or semiconductor system, apparatus, or device, or any suitable combination of the foregoing.

More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), a blu-ray disc, an optical storage device, a magnetic tape, a Bernoulli drive, a magnetic disk, a magnetic storage device, a punch card, integrated circuits, other digital processing apparatus memory devices, or any suitable combination of the foregoing, but would not include propagating signals. In the context of this document, a computer readable storage medium may be any tangible medium that can contain, or store a program for use by or in connection with an instruction execution system, apparatus, or device.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the disclosure may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the disclosure. However, the disclosure may be practiced without one or more of the specific details, or with other methods, components, materials, and so forth. In other instances, well-known structures, materials, or operations are not shown or described in detail to avoid obscuring aspects of the disclosure.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the schematic flowchart diagrams and/or schematic block diagrams block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present disclosure. In this regard, each block in the schematic flowchart diagrams and/or schematic block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer instructions.

The description of elements in each figure may refer to elements of proceeding figures. Like numbers refer to like elements in all figures, including alternate embodiments of like elements.

According to various embodiments, a non-volatile memory controller manages one or more non-volatile memory devices. The non-volatile memory device(s) may comprise memory or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device). Memory units may include, but are not limited to: pages, memory divisions, erase blocks, sectors, blocks, collections or sets of physical storage locations (e.g., logical pages, logical erase blocks, described below), or the like.

The non-volatile memory controller may comprise a storage management layer ("SML"), which may present a logical address space to one or more storage clients. One example of an SML is the Virtual Storage Layer® of Fusion-io, Inc. of Salt Lake City, Utah. Alternatively, each non-volatile memory device may comprise a non-volatile memory media controller, which may present a logical address space to the storage clients. As used herein, a logical address space refers to a logical representation of memory resources. The logical address space may comprise a plurality (e.g., range) of logical addresses. As used herein, a logical address refers to any identifier for referencing a memory resource (e.g., data), including, but not limited to: a logical block address ("LBA"), cylinder/head/sector ("CHS") address, a file name, an object identifier, an inode, a Universally Unique Identifier ("UUID"), a Globally Unique Identifier ("GUID"), a hash code, a signature, an index entry, a range, an extent, or the like.

The SML may maintain metadata, such as a forward index, to map logical addresses of the logical address space to media storage locations on the non-volatile memory device(s). The SML may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML may map logical addresses to physical data resources of any size and/or granularity, which may or may not correspond to the underlying data partitioning scheme of the non-volatile memory device(s). For example, in some embodiments, the non-volatile memory controller is configured to store data within logical memory units that are formed by logically combining a plurality of physical memory units, which may allow the non-volatile memory controller to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (each non-volatile memory element being accessible in parallel). As used herein, a logical memory division refers to a set of two or more physical memory divisions, each physical memory division on a respective non-volatile memory element in the respective logical memory element.

The logical address space presented by the storage management layer may have a logical capacity, which may correspond to the number of available logical addresses in the logical address space and the size (or granularity) of the data referenced by the logical addresses. For example, the logical capacity of a logical address space comprising 2^32 unique logical addresses, each referencing 2048 bytes (2 KiB) of data may be 2^43 bytes. (As used herein, a kibibyte (KiB) refers to 1024 bytes). In some embodiments, the logical address space may be thinly provisioned. As used herein, a "thinly provisioned" logical address space refers to a logical address space having a logical capacity that exceeds the physical capacity of the underlying non-volatile memory device(s). For example, the storage management layer may present a 64-bit logical address space to the storage clients (e.g., a logical address space referenced by 64-bit logical addresses), which exceeds the physical capacity of the underlying non-volatile memory devices. The large logical address space may allow storage clients to allocate and/or reference contiguous ranges of logical addresses, while reducing the chance of naming conflicts. The storage management layer may leverage the any-to-any mappings between logical addresses and physical storage resources to manage the logical address space independently of the underlying physical storage devices. For example, the storage management layer may add and/or remove physical storage resources seamlessly, as needed, and without changing the logical addresses used by the storage clients.

The non-volatile memory controller may be configured to store data in a contextual format. As used herein, a contextual format refers to a self-describing data format in which persistent contextual metadata is stored with the data on the physical storage media. The persistent contextual metadata provides context for the data it is stored with. In certain embodiments, the persistent contextual metadata uniquely identifies the data that the persistent contextual metadata is stored with. For example, the persistent contextual metadata may uniquely identify a sector of data owned by a storage client from other sectors of data owned by the storage client. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data. The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media, a memory division index, or the like).

In some embodiments, the contextual data format may allow data context to be determined (and/or reconstructed) based upon the contents of the non-volatile memory media, and independently of other metadata, such as the arbitrary, any-to-any mappings discussed above. Since the media location of data is independent of the logical address of the data, it may be inefficient (or impossible) to determine the context of data based solely upon the media location or media address of the data. Storing data in a contextual format on the non-volatile memory media may allow data context to be determined without reference to other metadata. For example, the contextual data format may allow the metadata to be reconstructed based only upon the contents of the non-volatile memory media (e.g., reconstruct the any-to-any mappings between logical addresses and media locations).

In some embodiments, the non-volatile memory controller may be configured to store data on one or more asymmetric, write-once media, such as solid-state storage media. As used herein, a "write once" storage medium refers to a storage medium that is reinitialized (e.g., erased) each time new data is written or programmed thereon. As used herein, an "asymmetric" storage medium refers to a storage medium having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media). The memory media may be partitioned into memory divisions that can be erased as a group (e.g., erase blocks) in order to, inter alia, account for the asymmetric properties of the media. As such, modifying a single data segment in-place may require erasing the entire erase block comprising the data, and rewriting the modified data to the erase block, along with the original, unchanged data. This may result in inefficient "write amplification," which may excessively wear the media. Therefore, in some embodiments, the non-volatile memory controller may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (the erasure latency is no longer part of the critical path of a write operation).

The non-volatile memory controller may comprise one or more processes that operate outside of the regular path for servicing of storage operations (the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client, identifying the logical addresses of the request, performing one or more storage operations on non-volatile memory media, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller comprises a groomer, which is configured to reclaim memory divisions (e.g., erase blocks) for reuse. The write out-of-place paradigm implemented by the non-volatile memory controller may result in obsolete or invalid data remaining on the non-volatile memory media. For example, overwriting data X with data Y may result in storing Y on a new memory division (rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media may accumulate a significant amount of invalid data. A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller may be further configured to store data in a log format. As described above, a log format refers to a data format that defines an ordered sequence of storage operations performed on a non-volatile memory media. In some embodiments, the log format comprises storing data in a pre-determined sequence of media addresses of the non-volatile memory media (e.g., within sequential pages and/or erase blocks of the media). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller may maintain a current append point at a media address of the non-volatile memory device. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller may identify the "next" available memory division (the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media, and independently of other metadata. As discussed above, invalid data may not be removed from the non-volatile memory media until the memory division comprising the data is reclaimed. Therefore, multiple "versions" of data having the same context may exist on the non-volatile memory media (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description.

FIG. 1A is a block diagram of one embodiment of a system 100 comprising a data reliability module 150. The data reliability module 150 may be part of and/or in communication with a storage management layer (SML) 130. The SML 130 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 (and/or non-volatile memory controller 124) to a communication network, such as a Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the storage management layer 130 and/or one or more modules thereof may be embodied as one or more computer readable instructions stored on the non-transitory storage media 114.

The storage management layer 130 may be configured to provide storage services to one or more storage clients 116. The storage clients 116 may include local storage clients 116 operating on the computing device 110 and/or remote, storage clients 116 accessible via the network (and network interface 113). The storage clients 116 may include, but are not limited to: operating systems, file systems, database applications, server applications, kernel-level processes, user-level processes, applications, users, or the like.

Figure 1B:
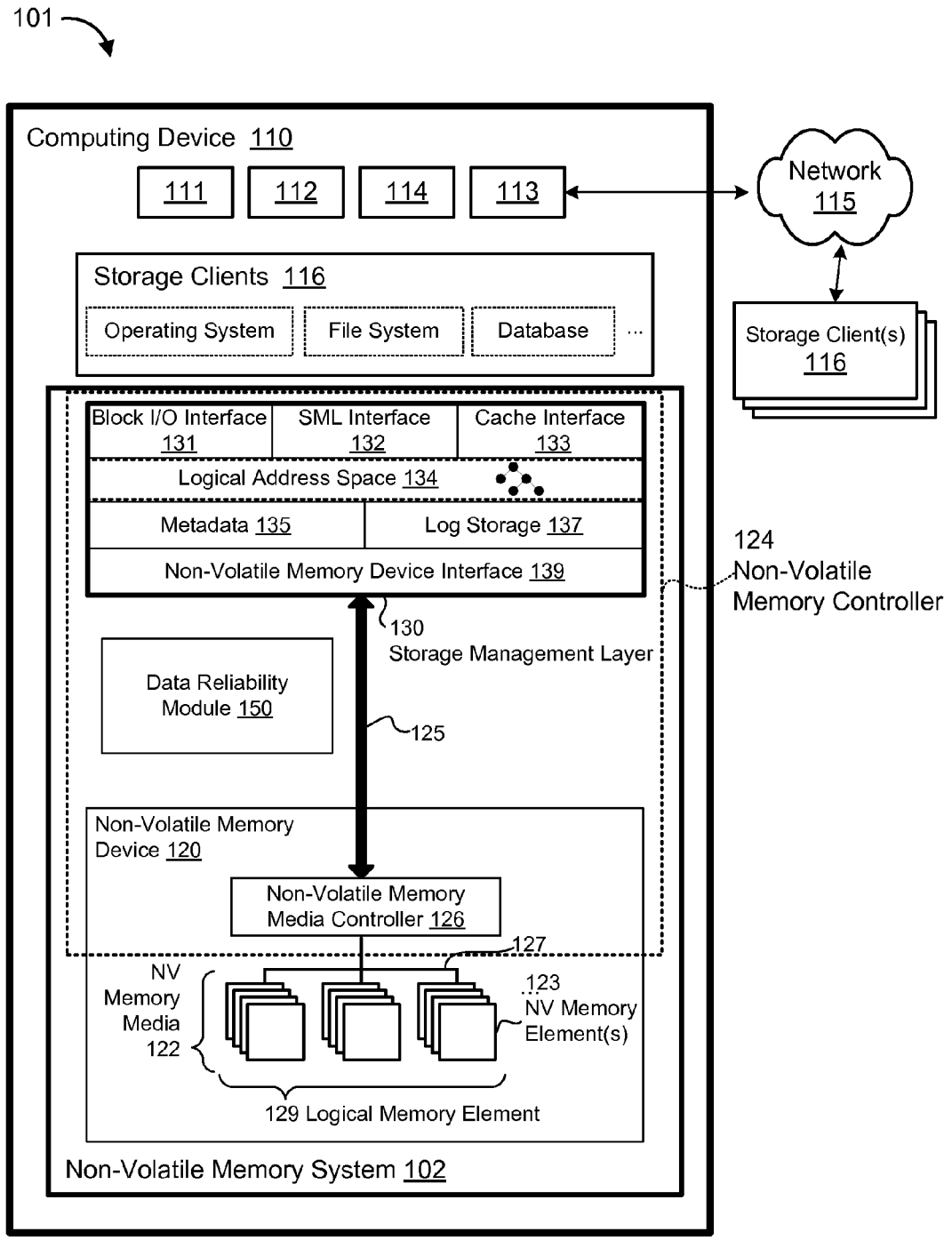
FIG. 1B is a schematic block diagram of another embodiment of a non-volatile memory system comprising a data reliability module.

The storage management layer 130 comprises and/or is communicatively coupled to one or more non-volatile memory devices 120A-N. The non-volatile memory devices 120A-N may include different types of non-volatile memory devices including, but not limited to: solid-state storage devices, hard drives, SAN storage resources, or the like. The non-volatile memory devices 120A-N may comprise respective non-volatile memory media controllers 126A-N and non-volatile memory media 122A-N. As illustrated in FIG. 1B, The SML 130 may provide access to the non-volatile memory devices 120A-N via a traditional block I/O interface 131. Additionally, the SML 130 may provide access to enhanced functionality (large, virtual address space) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the non-volatile memory devices 120A-N and/or the non-volatile memory media controllers 126A-N.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations on one or more of the non-volatile memory devices 120A-N. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122A-N, which define an ordered sequence of storage operations performed on the non-volatile memory devices 120A-N, as described above.

The SML 130 may further comprise a non-volatile memory device interface 139 configured to transfer data, commands, and/or queries to the non-volatile memory devices 120A-N over a bus 125, which may include, but is not limited to: a peripheral component interconnect express ("PCI Express" or "PCIe") bus, a serial Advanced Technology Attachment ("ATA") bus, a parallel ATA bus, a small computer system interface ("SCSI"), FireWire, Fibre Channel, a Universal Serial Bus ("USB"), a PCIe Advanced Switching ("PCIe-AS") bus, a network, Infiniband, SCSI RDMA, or the like. The non-volatile memory device interface 139 may communicate with the non-volatile memory devices 120A-N using input-output control ("IO-CTL") command(s), IO-CTL command extension(s), remote direct memory access, or the like.

The non-volatile memory system 102, in the depicted embodiment, includes a data reliability module 150 for managing reliability of data with various priorities, service levels, or the like in the non-volatile memory device 120. The data reliability module 150, in one embodiment, is configured to determine a priority for data of a non-volatile memory device 120, where the non-volatile memory device 120 includes a plurality of cells, each cell encodes or otherwise includes a plurality of bits, and the bits of a cell provide distinct and/or varying levels of quality of service due to different error rates or the like. The data reliability module 150 may take advantage of inherent differences in bits that a storage cell encodes to provide different levels of quality of service, may adjust or manipulate guard bands of a storage cell to provide different levels of quality of service, or the like. In certain embodiments, the data reliability module 150 selects one or more bits of the plurality of cells for storing the data based on the priority of the data and the level of quality of service of the one or more selected bits. Also, in further embodiments, the data reliability module 150 manages the data to satisfy a write order for the plurality of bits. Using a data reliability module 150 to manage data reliability as disclosed herein, in certain embodiments, allows a non-volatile memory device 120 to provide distinct, varying levels of quality of service and/or different error rates for data of different priorities, and to read data, or at least partially correct errors in data stored at a lower quality of service, by using error information from other data stored in the same cells, at a higher quality of service.

In one embodiment, the data reliability module 150 may comprise executable software code, such as a device driver, SML 130, or the like, stored on the computer readable storage media 114 for execution on the processor 111. In another embodiment the data reliability module 150 may comprise logic hardware of one or more of the non-volatile memory devices 120A-N, such as a non-volatile memory media controller 126A-N, a non-volatile memory controller 124, a device controller, a field-programmable gate array ("FPGA") or other programmable logic, firmware for an FPGA or other programmable logic, microcode for execution on a microcontroller, an application-specific integrated circuit ("ASIC"), or the like. In a further embodiment, the data reliability module 150 may include a combination of both executable software code and logic hardware.

In one embodiment, the data reliability module 150 is configured to receive storage requests from the SML 130 via a bus 125 or the like. The data reliability module 150 may be further configured to transfer data to/from the SML 130 and/or storage clients 116 via the bus 125. Accordingly, the data reliability module 150, in some embodiments, may comprise and/or be in communication with one or more direct memory access ("DMA") modules, remote DMA modules, bus controllers, bridges, buffers, and so on to facilitate the transfer of storage requests and associated data. In another embodiment, the data reliability module 150 may receive storage requests as an API call from a storage client 116, as an IO-CTL command, or the like. The data reliability module 150 is described in greater detail below with regard to FIGS. 3 and 4.

FIG. 1B is a block diagram of another embodiment of a system 101 comprising a data reliability module 150. As described above, the data reliability module 150 may be part of and/or in communication with a storage management layer 130. The SML 130 may operate on a non-volatile memory system 102 of a computing device 110, which, as discussed above, may comprise a processor 111, volatile memory 112, communication interface 113, and non-transitory, computer readable storage media 114. The communication interface 113 may comprise one or more network interfaces configured to communicatively couple the computing device 110 (and/or non-volatile memory controller 124) to a network 115 and/or to one or more remote, network-accessible storage clients 116.

The computing device 110 may comprise a non-volatile memory controller 124 that is configured to provide storage services to the storage clients 116. The storage clients 116 may include local storage clients 116 operating on the computing device 110 and/or remote, storage clients 116 accessible via the network 115 (and network interface 113). The non-volatile memory controller 124 comprises one or more non-volatile memory devices 120. Although FIG. 1B depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory ("nano RAM or NRAM"), nanocrystal wire-based memory, silicon-oxide based sub-10 nanometer process memory, graphene memory, Silicon-Oxide-Nitride-Oxide-Silicon ("SONOS"), resistive RAM ("RRAM"), programmable metallization cell ("PMC"), conductive-bridging RAM ("CBRAM"), magneto-resistive RAM ("MRAM"), dynamic RAM ("DRAM"), phase change RAM ("PRAM or PCM"), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on (and read data from) the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (a page of each element of non-volatile memory media 122).

The non-volatile memory controller 124 may comprise a SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
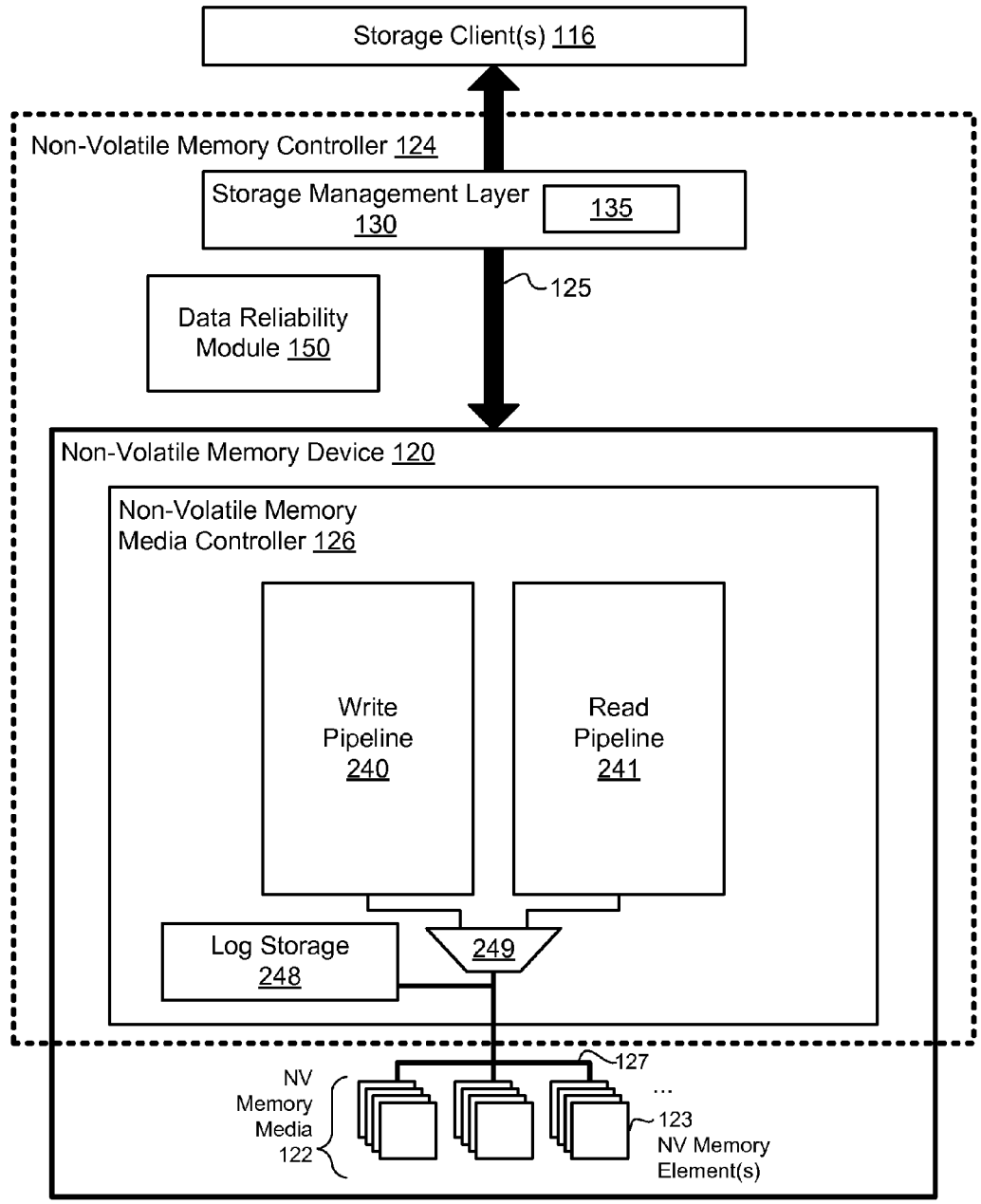
FIG. 2 is a schematic block diagram of another embodiment of a non-volatile memory system.

FIG. 2 depicts another embodiment of a non-volatile memory controller 124 configured to manage data reliability. The non-volatile memory device 120 may comprise a non-volatile memory media controller 126 and non-volatile memory media 122. The non-volatile memory media 122 may comprise a plurality of non-volatile memory elements 123, which may be communicatively coupled to the non-volatile memory media controller 126 via a bus 127, as described above.

The non-volatile memory media controller 126 may comprise a write pipeline 240 that is configured to store data on the non-volatile memory media 122 in a contextual format in response to requests received via the data reliability module 150. The requests may include and/or reference data to be stored on the non-volatile memory media 122, may include logical address(es) of the data, and so on. As described above, the contextual format may comprise storing a logical address of the data in association with the data on the non-volatile memory media 122. For example, the write pipeline 240 may be configured to format data into packets, and may include the logical address of the data in a packet header (or other packet field). The write pipeline 240 may be configured to buffer data for storage on the non-volatile memory media 122. In some embodiments, the write pipeline 240 may comprise one or more synchronization buffers to synchronize a clock domain of the non-volatile memory media controller 126 with a clock domain of the non-volatile memory media 122 (and/or bus 127).

The log storage module 248 may be configured to select media location(s) for the data and may provide addressing and/or control information to the non-volatile memory elements 123 via the bus 127. In some embodiments, the log storage module 248 is configured to store data sequentially in a log format within the non-volatile memory media. The log storage module 248 may be further configured to groom the non-volatile memory media, as described above. In certain embodiments the log storage module 248 is substantially similar to the log storage module 137 as described above. The log storage module 248 may be executed by the SML 130 and/or by the non-volatile memory media controller 126.

Upon writing data to the non-volatile memory media, the non-volatile memory media controller 126 may be configured to update metadata 135 (e.g., a forward index) to associate the logical address(es) of the data with the media address(es) of the data on the non-volatile memory media 122. In some embodiments, the metadata 135 may be maintained on the non-volatile memory media controller 126; for example, the metadata 135 may be stored on the non-volatile memory media 122, on a volatile memory (not shown), or the like. Alternatively, or in addition, the metadata 135 may be maintained within the SML 130 (e.g., on a volatile memory 112 of the computing device 110 of FIGS. 1A and 1B). In some embodiments, the metadata 135 may be maintained in a volatile memory by the SML 130, and may be periodically stored on the non-volatile memory media 122.

The non-volatile memory media controller 126 may further comprise a read pipeline 241 that is configured to read contextual data from the non-volatile memory media 122 in response to requests received via the request module 250. The requests may comprise a logical address of the requested data, a media address of the requested data, and so on. The read pipeline 241 may be configured to read data stored in a contextual format from the non-volatile memory media 122 and to provide the data to the SML 130 and/or a storage client 116. The read pipeline 241 may be configured to determine the media address of the data using a logical address of the data and the metadata 135. Alternatively, or in addition, the SML 130 may determine the media address of the data and may include the media address in the request. The log storage module 248 may provide the media address to the non-volatile memory elements 123, and the data may stream into the read pipeline 241 via a buffer. The read pipeline 241 may comprise one or more read synchronization buffers for clock domain synchronization, as described above.

The non-volatile memory media controller 126 may further comprise a multiplexer 249 that is configured to selectively route data and/or commands to/from the write pipeline 240 and the read pipeline 241. In some embodiments, non-volatile memory media controller 126 may be configured to read data while filling a buffer of the write pipeline 240 and/or may interleave one or more storage operations on one or more banks of non-volatile memory elements 123 (not shown).

Figure 3:
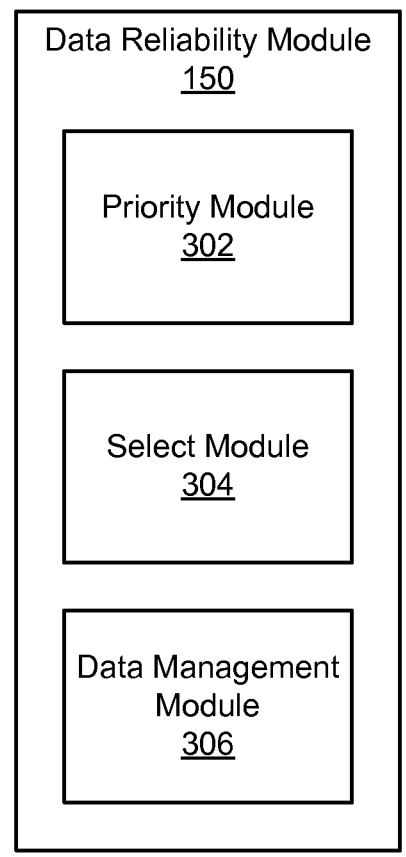
FIG. 3 is a schematic block diagram illustrating one embodiment of a data reliability module.

FIG. 3 depicts one embodiment of a data reliability module 150. The data reliability module 150 may be substantially similar to the data reliability module 150 described above with regard to FIGS. 1A, 1B, and 2. In general, as described above, the data reliability module 150 allows a non-volatile memory device 120 to store data of distinct priorities at different levels of quality of service and/or error rates, using properties of the non-volatile memory media 122. In the depicted embodiment, the data reliability module 150 includes a priority module 302, a select module 304, and a data management module 306. In another embodiment, the data reliability module 150 may or may not include the data management module 306, and may include one or more other modules as described below with regard to FIG. 4.

The priority module 302, in one embodiment, is configured to determine a priority, service level, or other ranking for data of a non-volatile memory device 120. In various embodiments, a means for determining a priority for data may include a priority module 302, a data reliability module 150, a non-volatile memory controller 124, a non-volatile memory media controller 126, a device driver such as an SML 130, a processor 111, a write pipeline 240, other logic hardware and/or other executable code stored on a computer readable storage medium. Other embodiments may include similar or equivalent means for determining a priority for data.

In one embodiment, the priority module 302 determines a priority for data received with a storage request to write data to the non-volatile memory device 120. In another embodiment, the priority module 302 determines a priority for data already stored by the non-volatile memory device 120. For example, the priority module 302 may determine a priority for data during a storage capacity recovery operation, such as grooming or garbage collection, during a background scan of the non-volatile memory media 122, or the like.

In one embodiment, the non-volatile memory device 120 may be in communication with a host device, such as a computing device 110, over a communications bus, such as the bus 125. In a certain embodiment, the non-volatile memory media 122 of the non-volatile memory device 120 includes a plurality of storage cells. As used herein, a "cell" refers to the smallest physical unit of storage or memory of non-volatile memory media 122. In some embodiments, each cell has a physical and/or electrical property which may be altered to encode or otherwise store data. For example, in Flash memory, a cell may include a floating gate transistor, and the physical property used to encode data may be the charge stored on the floating gate, the threshold voltage $V_t$ that is sufficient to make the transistor conduct when applied to the control gate, or the like. As another example, in phase change memory, a cell may be a region of chalcogenide glass, and the physical property used to encode data may be the degree of crystallization of the region, the electrical resistance of the cell, or the like. As described above with regard to the non-volatile memory media 122, many types of cells may encode data of a non-volatile memory device 120 for use with the data reliability module 150.

In one embodiment, the range of possible values for the data-encoding physical property of a cell is divided into discrete states or abodes, so that each state encodes one or more possible data values. In some embodiments, the states are configured to encode values for a plurality of bits. For example, if a cell stores two bits using four states, each state may encode a different value for the two bits of the cell, such as "11," "01," "00," or "10." In a further embodiment, the states of a cell may be separated by guard bands. As used herein, a "state" or "abode" refers to a sub-range of possible values for the data-encoding physical property of a cell, so that each state corresponds to a single set of one or more data values. States and guard bands are described in further detail below with regard to FIG. 5A.

In some embodiments, an encoding maps states of a cell to data values. In general, an encoding is a mapping that allows each state of a cell to represent a corresponding data value or set of data values. For example, in a cell with two states, the encoding may map the lower state to a binary "1" and the upper state to a binary "0," so that the cell stores 1 bit of information. As another example, in a cell with four states, a Gray code encoding or the like may map the four states L0, L1, L2, and L3 to the data values "11," "01," "00," and "10,"

respectively, so that the cell stores two bits of information. The non-volatile memory media 122 may store data using other encodings. Encodings are described in further detail below with regard to FIG. 5B. In general, cells with more states can encode more information.

In some embodiments, each cell includes, or encodes, a plurality of bits. In another embodiment, more generally, each cell may include, or encode, a plurality of digits. As used herein, a "digit" may refer to a bit (e.g., a binary digit) and/or to an n-ary digit in another, non-binary base. As an example of a cell encoding multiple bits, the four-state cell discussed above encodes two bits. Similarly, an eight-state cell may encode three bits. Using a non-binary base, a nine-state cell may encode two ternary digits. In another embodiment, the digits of a cell may be mixed-base digits. For example, a 6-state cell may encode one bit and one ternary digit. In this manner, a cell with a composite (e.g., non-prime) number of states may include and/or encode a plurality of digits.

Although increasing the number of states per cell can increase the storage capacity of a non-volatile memory device 120, an increase in the number of states may also increase an error rate in the cells, due to the smaller sizes of the encoding states and various error-causing phenomena which may change the data-encoding physical property of a cell. For example, in Flash memory, error-causing phenomena may include read disturbs, program disturbs, stress-induced leakage current, and similar phenomena affecting the stored charge in the floating gate of a cell. Different types of cells may experience a variety of different types of error-causing phenomena.

If error-causing phenomena cause a cell to drift into an unintended state, different than the stored or programmed state, an error occurs. Most error-causing phenomena cause small changes to the data-encoding physical property of a cell, so that errors occur between adjacent states. Increasing the number of states per cell may decrease the size of encoding states, making errors more likely. Using binary, n-ary, or mixed base digits for the digits of a cell, in certain embodiments, provides flexibility in setting the number of states per cell, to determine the amount of information stored by the cells. For example, in one embodiment, a cell may use four states to store two bits without the bit error rate becoming problematic, but may not be able to reliably use eight states to store three bits. However, if the cell is not limited to using binary digits, the same cell may be able to reliably use six states to store one binary digit and one ternary digit, the informational equivalent of 2.58 bits. In certain embodiments, the non-volatile memory media controller 126, the SML 130, or the like may translate, combine, or otherwise transform non-binary digits from several cells into binary digits for use by storage clients 116.

In embodiments of the non-volatile memory device 120 where each cell encodes a plurality of bits, the bits of a cell may provide distinct, different, and/or varying levels of quality of service or error rates. In one embodiment, each bit of a cell may provide a different level of quality of service from the other bits of a cell. In another embodiment, two or more bits of a cell may provide the same level of quality service as each other, and another bit for the cell may provide another distinct level of quality of service. In various embodiments, a level of quality of service may include and/or be based on a performance level, a reliability level, an error rate (e.g., an uncorrectable bit error rate "UBER," a raw bit error rate "RBER," or the like), or another quality provided by a cell. The levels of quality of service may be different for different bits of a cell, depending on factors such as the arrangement of states in the cell, the encoding that is used, the size and position of guard bands between states in a cell, or the like.

For example, consider the four-state cell with the Gray code encoding described above, mapping states L0, L1, L2, and L3 onto data values "11," "01," "00," and "10." The first bit of the encoded values may be referred to as the most significant bit ("MSB") and the last bit may be referred to as the least significant bit ("LSB"). Because most errors occur between adjacent states, the MSB may be expected to experience errors more often than the LSB (e.g., have a higher error rate) because, in the example encoding, the MSB flips (e.g., transitions from a one to a zero or vice versa) between each adjacent state, but the LSB flips or transitions just between states L1 and L2. Guard bands between states may be sized or positioned to reduce or exaggerate this difference in error rates caused by the different number of bit flips or transitions for different bits.

Similarly, a read algorithm using a divide-and-conquer approach may be able to read the LSB faster than the MSB, because reading the LSB may just involves testing if the cell is above or below the L1-L2 transition, while reading the MSB may involve additional tests. Thus, in certain embodiments, the LSB bit may provide a higher level of reliability and/or a higher level of performance than the MSB bit. This example is intended as illustrative, not limiting, as the bits of a cell, in various embodiments, may provide distinct levels of quality of service in many different ways. Reasons why different bits of a cell provide different levels of quality of service are explained in further detail below with regard to FIGS. 5A and 5B. In general, bits providing distinct levels of quality of service are used to store data of distinct priorities, as determined by the priority module 302.

In one embodiment, the select module 304 is configured to select one or more bits from the plurality of cells, or from a set of cells such as a logical or physical page of the non-volatile memory device 120, a logical or physical erase block of the non-volatile memory device 120, or the like for storing the data. In a further embodiment, the select module 304 may cooperate with the priority module 302 to select one or more bits based on the priority of the data and the level of quality of service of the one or more selected bits. In various embodiments, a means for selecting one or more bits for storing the data may include a select module 304, a data reliability module 150, a non-volatile memory controller 124, a non-volatile memory media controller 126, a device driver such as an SML 130, a processor 111, a write pipeline 240, other logic hardware and/or other executable code stored on a computer readable storage medium. Other embodiments may include similar or equivalent means for selecting one or more bits for storing the data.

In one embodiment, the select module 304 selects one or more bits with a level of quality of service equal to the level indicated by the priority of the data. In another embodiment, the select module 304 selects one or more bits with a level of quality of service greater than or equal to the level indicated by the priority of the data.

In some embodiments, the priority module 302 determines a priority for the data based on an access frequency for the data, and the select module 304 selects one or more bits providing a level of quality of service corresponding to or satisfying the access frequency. An access frequency may include an access history or access count for the data, an access frequency indicated by a client 116, an estimated access frequency based on the type of data, or another indicator of a frequency with which data has been or is expected to be accessed.

In certain embodiments, an access frequency for data may indicate a priority of the data, and the select module 304 may select one or more bits for storing the data based on the access frequency. For example, in one embodiment, the priority module 302 may determine a higher priority for frequently accessed data, and the select module 304 may select one or more bits with a level of quality of service that is correspondingly higher, to reduce access times for frequently accessed data or the like. Correspondingly, in a further embodiment, the priority module 302 may determine a lower priority for infrequently accessed data, and the select module 304 may select one or more bits with a level of quality of service correspondingly lower. In another embodiment, a high priority of frequently accessed data may indicate to the select module 304 that the frequently accessed data is to be stored by bits with a level of quality of service that provides higher reliability than other bits.

In some embodiments, the priority module 302 determines a priority for the data based on a reliability level selected for the data, and the select module 304 selects one or more bits providing a level of quality of service satisfying the selected reliability level. A reliability level, in one embodiment, comprises a determined, estimated, and/or mandated threshold associated with the accuracy of data. A reliability level may comprise an acceptable error rate for data, an amount of time for which data is to remain accurate and accessible, or the like. A reliability level may include or be based on a use type for the data, an owner of the data, a reliability level selected or otherwise indicated by a client 116, an estimated reliability level, a negotiated or contracted quality-of-service level for the data, an age of the data, or another indicator of reliability requirements for the data.

For example, in one embodiment, data may include executable program code for an application, where an error in one bit may change an instruction, causing a program crash or other error, so the select module 304 may select a high reliability level for the data. In another embodiment, data may include video data, where an error in one bit affects the color of one pixel in one frame, or the like. In this case, an error may be substantially undetectable to a user, and may not cause a software or hardware error, and the select module 304 may select a lower reliability level for the data. In further embodiments, the select module 304 selects one or more bits that provide a level of quality of service with a reliability level that satisfies the reliability level for the data.

In some embodiments, the priority module 302 determines a priority for the data based on a retention level selected for the data, and the select module 304 selects one or more bits providing a level of quality of service satisfying the selected retention level. A retention level, in one embodiment, comprises a determined, estimated, and/or mandated threshold associated with the retention of data. A retention level may comprise an amount of time for which data is to remain accurate and accessible, an amount of time before data may be erased, evicted, cleared, trimmed, or otherwise removed from the non-volatile memory device 120, an amount of time before data may become corrupted by charge leakage in the cells, increases in charge due to disturbing cells when programming other cells, or other error-causing phenomena, or the like. A retention level may include or be based on a use type for the data, an owner of the data, a retention level selected or otherwise indicated by a client 116, an estimated retention level, a negotiated or contracted quality-of-service level for the data, or the like.

For example, in one embodiment, the non-volatile memory device 120 may act as a cache for a backing store storage device, so that certain data may be temporarily stored in the non-volatile memory device 120 and may at some point be evicted from the non-volatile memory device 120. If certain data cached in the non-volatile memory device 120 is also stored in the backing store (e.g., clean write data that has already been destaged to the backing store, cached read data, or the like), the priority module 302 may select a retention level for the data that is lower than a retention level that the priority module 302 selects for dirty write data, which has not yet been destaged to the backing store, because the non-volatile memory device 120 may store the sole copy of the dirty data, or the like. Similarly, the non-volatile memory device 120 may provide long-term data storage, and the priority module 302 may select a higher retention level for the long-term data than for cached data, or the like. In this case, the bits the select module 304 selects may provide a level of quality of service with a higher reliability level than other bits storing cached data, to satisfy the higher retention level of the long-term data, or the like.

In additional embodiments, the priority module 302 determines a priority for the data based on a performance level selected for the data, and the select module 304 selects one or more bits providing a level of quality of service satisfying the selected performance level. The performance level selected for the data may depend on access frequency, as discussed above, or on other factors. A performance level, in one embodiment, comprises a determined, estimated, and/or mandated threshold associated with performance of the non-volatile memory device 120 when accessing data associated with the performance level. A performance level may comprise a speed for a storage operation, an execution time, a number of input/output operations per second ("IOPS"), or another indicator of performance. A performance level may include or be based on a use type for the data, an owner of the data, a performance level selected or otherwise indicated by a client 116, an estimated performance level, a negotiated or contracted quality-of-service level for the data, an age of the data, or another indicator of performance requirements for the data.

For example, in one embodiment, the priority module 302 may select a higher performance level for data accessed when a computing device 110 boots than for other data, so that the one or more selected bits provide a level of quality of service with a faster performance level for boot data, or the like. In another embodiment, the priority module 302 may select a lower performance level for data used by a computing device 110 for background tasks than other data, so that the one or more selected bits provide a level of quality of service with a slower performance level for the background data, to satisfy the selected performance level for the data and reserve higher-performing bits for data of more visible, foreground tasks or the like.

In one embodiment, the priority module 302 determines a priority for data based on a priority indicator received from a client 116 or another priority designation associated with the data. The select module 304 may select one or more bits for storing the data having a quality of service indicated by a priority indicator received from a client 116 or another associated priority. The priority module 302 may receive a priority indicator for data in various ways. For example, in one embodiment, the priority module 302 may receive a storage request, a write request, or the like that includes data and a priority indicator or another priority designation. In a further embodiment, the priority module 302 may provide an extended write command allowing a client 116 to include a priority indicator with a write request, and may receive the storage request data and priority indicator via the modified write command. For example, in some embodiments, an extended write command may be configured to designate the priority of the operation based on the name of the write command, a parameter provided with the write command, or the like. In one embodiment, the storage request may comprise a conventional storage request that includes the priority indicator. In another embodiment, the storage request may comprise an extended storage request defined specifically for designating a storage operation priority, (e.g., high_priority_write(data source_address, LBA, length);), in other words the type of storage request may indicate the level of priority for the associated data.

Figure 4:
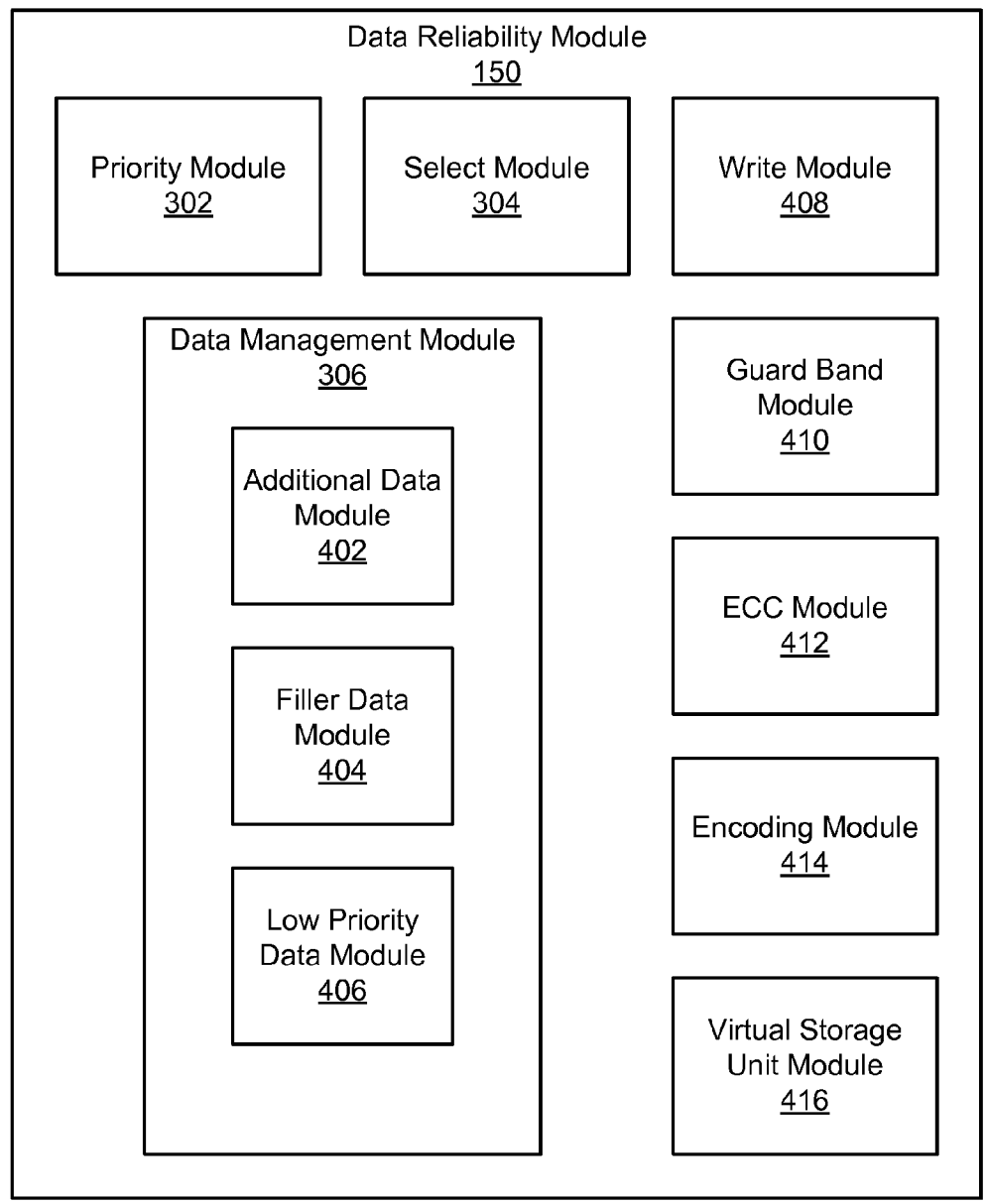
FIG. 4 is a schematic block diagram illustrating another embodiment of a data reliability module.

In certain embodiments, the priority module 302 may provide an API allowing clients 116 to define a priority with data; the priority module 302 may provide a modified or extended system call for writing data, so that a client 116 may send a priority indicator with a write request; the priority module 116 may receive a priority indicator for data through one or more of the interfaces 131, 132, 133; the priority module 302 may provide multiple different system calls for writing data of multiple priorities; the SML 130 may maintain separate file systems for data of different priorities, so that the file system or volume chosen by the client 116 for storing data is a priority indicator as described below with regard to the virtual storage unit module 416 of FIG. 4; or may otherwise receive an association or designation of a priority for data. In other embodiments, the priority module 302 may determine a priority for data substantially transparently to a client 116, based on an access history for the data, a determined use type for the data, an owner of the data, a negotiated or contracted quality-of-service level for the data, an age of the data, a logical address of the data, or the like.

In one embodiment, the data management module 306 is configured to manage data written or programmed to different bits of the non-volatile memory media 122 to satisfy a write order for the bits. In a certain embodiment, the data management module 306 is configured to queue write operations for writing or programming the data in an order that satisfies the write order. As described above, the select module 304 may select different bits of the same cells to store data of different priorities, which may be received at different times, from different clients 116, in different amounts, or the like. The data management module 306, in certain embodiments, ensures that the non-volatile memory media controller 126 writes or programs data for different bits in a matter that satisfies a write order, if any, associated with the different bits. In various embodiments, a means for managing the data to satisfy the write order may include a data management module 306, an additional data module 402, a filler data module 404, or a low priority data module 406 as described below with regard to FIG. 4, a data reliability module 150, a non-volatile memory controller 124, a non-volatile memory media controller 126, a device driver such as an SML 130, a processor 111, a write pipeline 240, other logic hardware and/or other executable code stored on a computer readable storage medium. Other embodiments may include similar or equivalent means for managing the data to satisfy the write order.

As used herein, a "write order" for bits of cells refers to a specified order for writing or programming data to bits of the non-volatile memory device 120. For example, in one embodiment, each cell of the non-volatile memory media 122 of the non-volatile memory device 120 may provide an MSB and an LSB as described above, so that a set of cells provides an MSB page (e.g., upper page) and an LSB page (e.g., lower page) for storing data. In a further embodiment, a write order for the non-volatile memory media 122 may specify that data is written or programmed to bits of the LSB page before the bits of the MSB page for the same cells, or the like. In another embodiment, a write order may specify that data is written or programmed to bits of a first set of cells before a second set of cells, for wear leveling purposes or the like. In light of this disclosure, many write orders are possible for bits of cells of the non-volatile memory media 122, based on the type of memory media 122 or other considerations, and that other types of non-volatile memory media 122 may not have a predefined write order.

In one embodiment, the data management module 306 satisfies a write order by queuing data of one priority with additional data of another priority, as described below with regard to the additional data module 402 of FIG. 4, so that the data of both priorities can be written or programmed in the associated write order. In another embodiment, the data management module 306 satisfies a write order by using filler data, as described below with regard to the filler data module 404 of FIG. 4, so that data is written or programmed to one or more selected bits in the associated write order, with filler data being written or programmed to other bits. In a further embodiment, the data management module 306 satisfies a write order by writing or programming low priority data to both bits with high and low levels of quality of service, as described below with regard to the low priority data module 406 of FIG. 4, so that the write order for the bits is satisfied. The data management module 306 may manage data in other ways to satisfy a write order, depending on the particular write order.

FIG. 4 depicts another embodiment of a data reliability module 150. The data reliability module 150, in certain embodiments, may be substantially similar to the data reliability module 150 described above with regard to FIG. 1A, FIG. 1B, FIG. 2, and/or FIG. 3. In the depicted embodiment, the data reliability module 150 includes a priority module 302, a select module 304, and a data management module 306, which may be configured substantially as described above with regard to FIG. 3. The data reliability module 150, in the depicted embodiment, includes a write module 408, a guard band module 410, an error correcting code ("ECC") module 412, an encoding module 414, and a virtual storage unit module 416. The data management module 306, in the depicted embodiment, includes an additional data module 402, a filler data module 404, and a low priority data module 406. The depicted embodiment is intended as illustrative and not limiting; non-depicted embodiments may include fewer modules than depicted or may include additional modules not described herein.

The data management module 306 may use one or more sub-modules for managing the data to satisfy the write order, such as the additional data module 402, the filler data module 404, and/or the low priority data module 406. In various embodiments, the data management module 306 may include all, some, or none of the depicted sub-modules. In one embodiment, the additional data module 402 is configured to identify additional data for writing or programming to non-selected bits, and to queue or buffer the data and the additional data for writing or programming to the non-volatile memory media 122 in the write order for the plurality of bits, such that the data is stored in the one or more selected bits, and the additional data is stored in the non-selected bits. For example, if the priority module 302 determines that the priority for one set of data is high and the select module 304 selects a first bit for the set of data, the additional data module 402 may identify additional low-priority data from another storage request for which the select module 304 has selected a second bit, or vice versa, so that the write module 408 may write or program the set of data and the additional data to the different bits in the write order for the bits.

In a further embodiment, the additional data module 402 may queue the data and the additional data together in alternating or rotating pages to satisfy a write order. For example, in one embodiment, one set of data may include three pages of high-priority data, but the write order may specify that data is written or programmed to a high-reliability LSB page, then an intermediate-reliability central significant bit ("CSB") page, then a lower-reliability MSB page for one group of cells before writing or programming data in the same page order to pages of a subsequent group of cells. In this case, the additional data module 402 may identify six pages of lower-priority additional data from another source and queue or buffer the data so that each page from the set of high priority data alternates between two pages of low priority data in the queue or buffer. Alternatively, in a similar embodiment, the additional data module 402 may identify three pages of intermediate-priority additional data, and three pages of low-priority additional data, and queue the data and the additional data for writing or programming to the LSB, CSB, and MSB pages in rotating order, or the like.

In one embodiment, the filler data module 404 is configured to store filler data to non-selected bits in order to satisfy the write order for the plurality of bits. For example, in a certain embodiment, the data may include three pages of high priority data with the write order specified as described above with regard to the additional data module 402, but if no additional data is available, the filler data module 404 may store filler data to one or more of the CSB and MSB pages, so that the high-priority data may be written or programmed to the high-reliability LSB pages, thus satisfying the write order. In one embodiment, storing filler data may include skipping bits or pages. For example, in Flash memory, the erased state of a cell may be encoded as a 1 for each bit of the cell, and filler data consisting of a string of 1s may be stored in non-selected bits simply by skipping them when writing to other bits. In another embodiment, storing filler data may include writing or programming filler data to the non-selected bits. Filler data may include a predetermined data pattern, such as a repeated string of ones or zeroes, or may include information such as metadata, ECC data, or the like. In one embodiment, the filler data module 404 may manage data in cooperation with the additional data module 402 and/or the low priority data module 406. In other embodiments, the filler data module 404 may manage data in place of the additional data module 402 and/or the low priority data module 406.

In some embodiments, the low priority data module 406 cooperates with the select module 304 to select one or more bits for writing or programming data so that at least a portion of the one or more selected bits provides a level of quality of service that is higher than indicated by the priority of the data, to satisfy the write order for the one or more selected bits. In this manner, each of the one or more selected bits provide a least a minimum level of quality of service, the write order is satisfied, and certain data may be stored in bits with a better quality of service than would otherwise be used. For example, in one embodiment, if a set of data includes three pages of low-priority data with the write order of LSB, CSB, MSB as described above, the low priority data module 406 may cooperate with the select module 304 to select one or more bits including the low-reliability MSB page bits for a group of cells, along with bits of the one or more of the CSB and LSB pages providing a higher level of quality of service, to satisfy the write order. The additional data module 402, the filler data module 404, and the low priority data module 406 may be used alone or in various combinations with each other to satisfy the write order for bits of storage cells of the non-volatile memory media 122.

In some embodiments, the write module 408 is configured to write or program the data to the one or more selected bits of the plurality of cells, to thereby provide a level of quality of service of the one or more selected bits to the written data. In various embodiments, a means for writing or programming the data may include a write module 408, a data reliability module 150, a non-volatile memory controller 124, a non-volatile memory media controller 126, a write pipeline 240, other logic hardware and/or other executable code stored on a computer readable storage medium. Other embodiments may include similar or equivalent means for writing or programming the data. The write module 408 may write the data to the one or more selected bits in response to the select module 304 selecting the bits, in response to the data management module 306 managing the data to satisfy the write order, or the like.

In one embodiment, each cell includes a plurality of states and one or more guard bands between states. For example, each cell may include a transition guard band between two states. In a further embodiment, the states are configured to encode values for the plurality of bits. In certain embodiments, the guard bands are configured such that bits of a cell provide distinct levels of quality of service. In one embodiment, the guard band module 410 is configured to adjust or otherwise configure the one or more guard bands such that a first bit of a cell provides a first level of quality of service and a second bit of the cell provides a second level of quality of service, so that different bits provide different levels of quality of service. In various embodiments, the data reliability module 150 may set, adjust, or manipulate, or otherwise configure guard bands at various granularities, such as per abode/storage state, per page (logical or physical), per erase block (logical or physical), per set of pages, per ECC chunk/codeword, per wordline, per chip, per die, per die plane, or the like.

In a further embodiment, where a first level of quality of service is greater than a second level of quality of service, the second level of quality of service may be at, near, and/or approaching an error correction threshold for the second bit. In other words, a low level of quality of service may be set so that an error rate for bits with the low level of quality of service is as close as possible to a maximum error correction threshold, so that errors in the bits with the low level of quality of service are still correctable, but so that an error rate associated with a higher level of quality of service may be minimized as much as possible.

In one embodiment, an error correction threshold comprises a number of errors in bits of data that is uncorrectable using an error correcting code for the bits of data. The guard band module 410 may define a size of a guard band, a position of a guard band, or the like. In certain embodiments, increasing the width of a guard band between two adjacent states of a cell may make one bit of the cell more reliable, but may involve narrowing the guard band between other states, making another bit of the cell less reliable. For example, in one embodiment, the guard bands of a cell may be configured to maximize the reliability of one bit by diminishing the reliability of a second bit to the point that the error rate for the second bit is near an error correction threshold, meaning that if the second bit experiences a slightly larger error rate, the second bit would not be correctable using the error correcting code for the plurality of cells.

In one embodiment, the level of quality of service for a bit of a cell is based on a size of a guard band between adjacent states with a transition for the bit in an encoding of the cell, as described in greater detail below with regard to FIGS. 5A and 5B. As used herein, a guard band comprises a range of a data-encoding physical property of a cell, such as a read voltage or the like, which separates states of the cell. In certain embodiments, a guard band may be defined as the difference between a level at which a data-encoding physical property of a cell is programmed or verified, and a level at which it is read. As one example, in the four-state Gray-encoded cell described above with states L0, L1, L2, and L3 mapped onto data values "11," "01," "00," and "10," the LSB is the second bit, which experiences a transition between the L1 and L2 states, transitioning from "01" to "00." Accordingly, widening the guard band between the L1 and L2 states will further increase the reliability of the LSB. Alternatively, narrowing the guard band between the L1 and L2 states may reduce the reliability of the LSB and allow the reliability of the MSB to be increased by widening guard bands between other states.

Providing different levels of quality of service for data of different priorities, in certain embodiments, facilitates error correction when the data is read. In one embodiment, the ECC module 412 is configured to use error information determined from a first data set from a first bit from each cell of a set of cells to read a second data set from a second bit from each cell of the set of cells. In one embodiment, error information may be determined by using an error correcting code. In another embodiment, data may be written to a non-volatile memory device 120 with a whitening bias so that each possible bit occurs with approximately equal frequency or another predetermined pattern, and error information may be determined from the frequency with which bits appear when the data is read (e.g., how the read data differs from the predetermined pattern). In a certain embodiment, the ECC module 412 may use error information from a more reliable set of bits with a higher quality of service level to correct data stored in a less reliable set of bits with a lower quality of service level, or the like. In another embodiment, the ECC module 412 may use error information from the more reliable set of bits as a hint to adjust at least one read voltage threshold $V_r$, in order to read the less reliable bits with increased accuracy, for example, to determine a direction of adjustment (e.g., up or down, increase or decrease) based on a direction of deviation indicated by the error information (e.g., toward a predefined state, toward binary ones, toward binary zeroes). In one embodiment, a user may have requested data from the first data set and the second data set, and the ECC module 412 may read both data sets in the course of fulfilling the user's request. In another embodiment, a user may have requested data from the second data set without requesting data from the first data set, and the ECC module 412 may read the first data set to obtain information which informs the process of reading or correcting the second data set.

In various embodiments, a means for using error information to partially correct a second data set may include an ECC module 412, a data reliability module 150, a non-volatile memory controller 124, a non-volatile memory media controller 126, a device driver such as an SML 130, a processor 111, a read pipeline 241, other logic hardware and/or other executable code stored on a computer readable storage medium. Other embodiments may include similar or equivalent means for using error information. For example, if data is written to one or more selected bits for each cell of a set of cells, and additional data is written to non-selected bits of each cell in the same set of cells, error information determined in response to reading the data from the one or more selected bits may be used to at least partially correct the additional data when it is read from the non-selected bits. Error information may include a number of errors, an indication of which bits were in error, a direction of an error (e.g., to which adjacent state a cell had drifted), or the like.

The ECC module 412, in various embodiments, may encode and decode data using Hamming codes, Reed-Solomon codes, Bose-Chaudhuri-Hocquenghem ("BCH") codes, Low-density parity check ("LDPC") codes, convolution codes, soft-decision algorithms, belief-propagation coding, or the like which may take advantage of soft error information from one set of bits to inform error correction of another set of bits for the same cells. In one embodiment, the ECC module 412 may set different read thresholds for the different bits of each cell. For example, if the non-volatile media 122 includes a multi-level cell ("MLC") flash memory cell with four states encoding two bits, one in an MSB page and one in a LSB page, the ECC module 412 may set read thresholds on a per-page basis, so that a read threshold for the LSB page provides more error tolerance than a read threshold for the MSB page, or vice versa. Accordingly, in various embodiments, the ECC module 412 may manage configuration parameters, such as read voltage thresholds or other storage thresholds, at various granularities, such as per abode/storage state, per page (logical or physical), per erase block (logical or physical), per set of pages, per ECC chunk/codeword, per wordline, per chip, per die, per die plane, or the like. In certain embodiments, the ECC module 412 may use different types of error correction for different bits of the same cell. In one embodiment, the ECC module 412 iteratively reads data sets from a set of cells, so that error information determined in earlier read iterations may be used to inform the error correction algorithm in later read iterations. For example, in a certain embodiment, the ECC module 412 may read a first data set of high-priority data from high-reliability bits of a set of cells, and correct the first data set using an error correcting code. In a further embodiment, the ECC module 412 may read a second data set of lower-priority data from lower-reliability bits of the same set of cells, and use information determined from correcting the first data set to read, or at least partially correct the second data set. If a read request requests the second data set, the ECC module 412 may issue a pre-read for the first data set in order to inform error correction for the second data set, or the like.

In some embodiments, the effects of error-causing phenomena may be skewed across the states of a cell. For example, in Flash memory, retention loss is a charge loss which affects states corresponding to larger stored charges more than it affects states in which the cell stores less charge. In embodiments where the effects of error-causing phenomena vary, or are skewed, the ECC module 214 may read information stored in less affected states first and use those results to inform read operations for information stored in the more affected states, which may or may not correspond to different bits, depending on the encoding used for the cells.

In one embodiment, the encoding module 414 is configured to determine or set a number of states per cell and an encoding for cells of the non-volatile memory media 122. In some embodiments, each cell may encode a plurality of bits in a power-of-two number of states per cell, so that each cell encodes a whole number of bits. For example, in one embodiment, the encoding module 414 may set the number of states per cell to eight, and may use a Gray code encoding to store three bits in each cell, as described below with reference to FIGS. 5A and 5B. In a certain embodiment, each cell may encode a plurality of digits in a non-power-of-two number of states per cell, such that at least one of the plurality of digits for each cell includes a non-binary digit. As used herein, a "power of two" refers to the number two raised to a positive integer power, so that powers of two include $2=2^1$, $4=$ 22, . . . , 32=$2^5$, and the like. Thus, a non-power-of-two number of states refers to a number of states not aligned with $2^n$, and not traditionally used to encode a binary value. Similarly, in various embodiments, a "non-binary" digit may refer to a ternary digit, or n-ary digit other than a base 2 (binary) digit.

An encoding module 414 using non-power-of-two numbers of states per cell may provide flexibility in setting the number of states per cell to determine the amount of information stored. For example, a cell may use eight states to store three bits without the bit error rate becoming problematic, but may not be able to reliably use sixteen states to store four bits. However, if the encoding module 414 uses a non-power-of-two number of states per cell, the same cell may be able to reliably use 9 states to store two ternary digits, the informational equivalent of 3.17 bits, or the like. The encoding module 414 may translate data from cells using a non-power-of-two number of states into binary for use by the clients 116, or the like.

In another embodiment, the level of quality of service for a bit of a cell may be correlated to or otherwise based on a number of transitions for the bit between adjacent states in an encoding of the cell selected by the encoding module 414. As used herein, a "transition" for a bit refers to the bit changing values between adjacent states. Similarly, a "transition guard band" for a bit may refer to a guard band between adjacent states with a transition for the bit. Because most errors occur when the cell drifts from its programmed state into an adjacent state, a bit with a small number of transitions between adjacent states in the encoding may experience fewer errors, on average, than a bit with a larger number of transitions between adjacent states in the encoding. Transitions are discussed in further detail below with regard to FIG. 5B.

In one embodiment, the virtual storage unit module 416 cooperates with the priority module 302 to determine a priority for the data. In some embodiments, the priority module 302 determines a priority for data based on a priority indicator received from a client 116, as discussed above with regard to FIG. 3. In a further embodiment, the priority indicator may include a virtual storage unit selected by the client 116 from a plurality of virtual storage units for storing the data. The virtual storage unit module 416 may provide a plurality of virtual storage units ("VSUs"). As used herein, a VSU is a data structure maintained by the virtual storage unit module 416 to logically divide the non-volatile memory device 120 into independent storage units or containers, so that the non-volatile memory device 120 may be shared between multiple clients 116. In one embodiment, each VSU may appear to a client 116 as a separate drive. In another embodiment, each VSU may appear to a client 116 as a file system mounted at a separate mount point of a root file system. Thus, a client 116 may select a VSU while selecting a location for storing the data, and the VSU may act as a priority indicator for determining the priority of the data.

Each VSU may have different properties and attributes, such as different use cases, different levels of quality of service ("QoS") levels, different logical address space types (e.g., sparse logical address space, contiguous logical address space), different replication attributes, different logical and/or physical storage capacities, or the like. VSUs, in certain embodiments, may be independently created, deleted, and managed. In another embodiment, each VSU is associated with a different append point of a sequential log-based writing structure of the non-volatile memory media 122, where the different append points are associated with different bits of the plurality of cells. Further embodiments of VSUs and of sequential log-based writing structures are described in U.S. patent application Ser. No. 13/357,534 entitled "Apparatus, System, and Method for Managing a Cache" and filed Jan. 24, 2012 for Jim Peterson et al., which is incorporated herein by reference in its entirety.

In embodiments where the virtual storage unit module 416 cooperates with the priority module 302 to determine a priority for data based on the associated VSU, a VSU may be associated with a bit of the storage cells of the non-volatile memory media 122. For example, a VSU with a higher priority may be associated with LSB bits and a VSU with a lower priority may be associated with MSB bits, or the like.

Figures 5A, 5B:
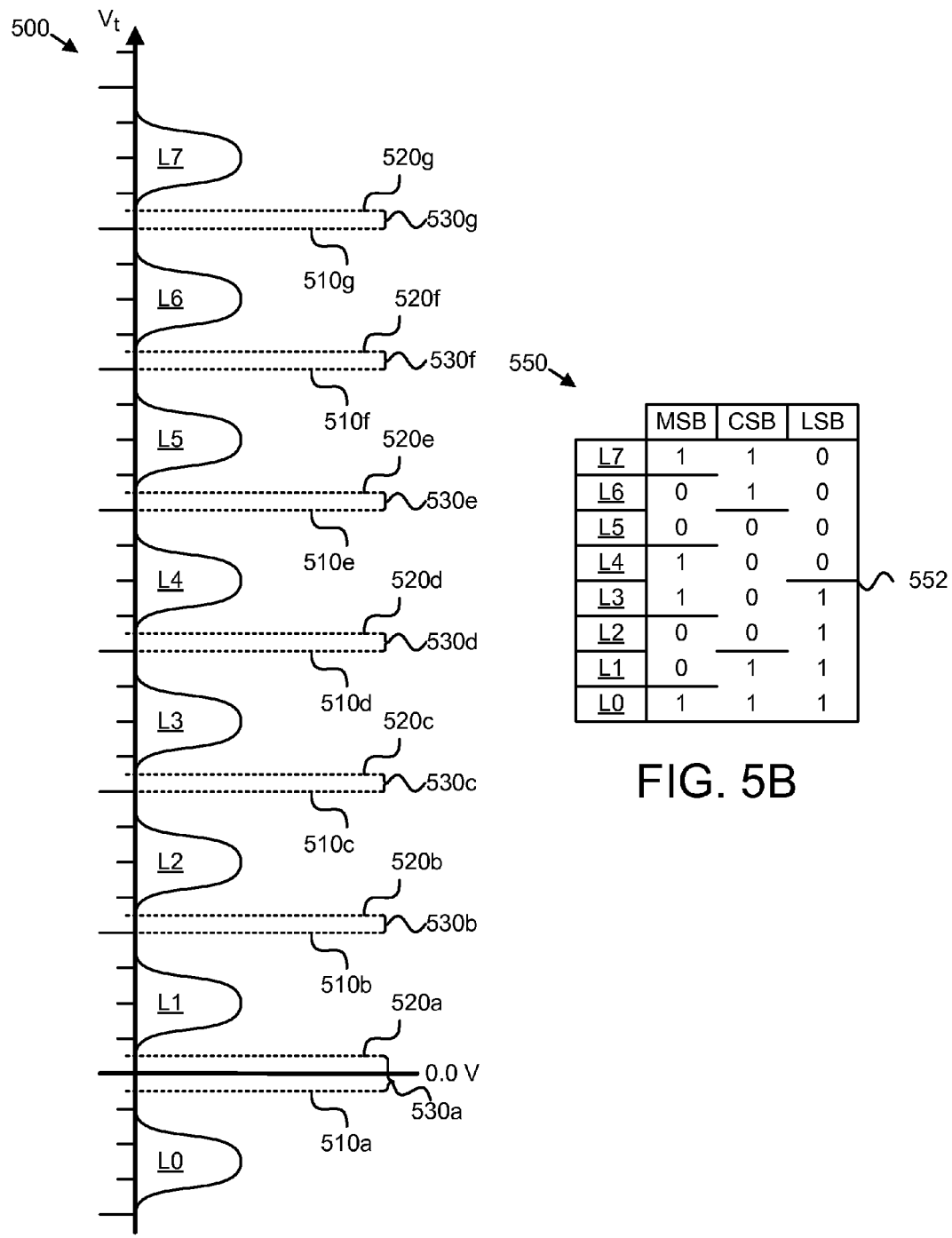
FIG. 5A is a graph illustrating one embodiment of states in cells of a non-volatile memory device.
FIG. 5B is a table illustrating one embodiment of an encoding of multiple bits by a cell of a non-volatile memory device.

FIG. 5A depicts a graph 500 of the distribution of cells in states of a non-volatile memory device 120. In the depicted embodiment, the non-volatile memory device 120 is a Flash memory device, and each cell has eight states, but various types of memory and numbers of states per cell may be used in other embodiments. In the depicted embodiment the data-encoding physical value of each cell is the read voltage level. The read voltage level, as used herein, refers to a voltage which causes the channel of a floating gate transistor conductive when a read voltage threshold ("$V_t$") is applied to the control gate. Data is stored in each cell by changing the amount of stored charge in the floating gate, which determines the read voltage level.

In the depicted embodiment, read voltage thresholds 510a-g divide the range of possible read voltage levels for a cell into states L0, L1, L2, L3, L4, L5, L6, and L7, where L0 is the erased state. In some embodiments, the erased state L0 may correspond to a negative read voltage level. If the read voltage level for a cell is below read voltage threshold 510a, the cell is in the L0 state. If the threshold voltage $V_t$ for a cell is above read voltage threshold 510a, but below read voltage threshold 510b, the cell is in the L1 state, and so on. In response to a cell being programmed (or erased), the state of the cell may be determined by applying a verify threshold voltage 520a-g to the control gate, and sensing if the cell conducts, to determine if the read voltage level is above or below the applied verify threshold voltage 520a-g. By using different voltage thresholds for the read voltage thresholds 510a-g and the verify threshold voltages 520a-g, the guard band module 410 forms guard bands 530a-g between the cell states.

Although the graph 500 depicts a uniform distribution of cells among the states L0-L7, a bell-shaped distribution of read voltage levels is depicted in each state, because each cell in a particular state may have a different read voltage level within the range of read voltage levels for the state, read voltage levels may drift over time, and the like. Variations in the cells and in the programming process may cause variations in the read voltage levels when the cells are programmed. Also, the read voltage level of a cell may drift from its originally programmed voltage over time due to read disturbs, program disturbs, stress-induced leakage current, or the like. Although a symmetric bell-shaped distribution is shown, skewed distributions and other distributions are possible. Over time, the distributions may widen or skew as cells drift from their originally programmed read voltage levels.

If the distribution widens beyond the nearest read voltage threshold 510a-g, then some cells have drifted into an adjacent state, causing errors. In order to reduce this effect, the states L0-L7 are separated by guard bands 530a-g. In general, a guard band comprises a range of a data-encoding physical property of a cell, such as a read voltage level or the like, which separates states of the cell. In the depicted embodiment, the guard bands are created when the cells are programmed, by verifying that each cell is programmed with a read voltage level above at least a verify voltage 520a-g, which is above or greater than the read voltage threshold V$_t$ 510*a-g*, which defines the lower edge of the state. Thus, in the depicted embodiment, the first guard band 530*a* includes the voltage range 530*a* between read voltage threshold 510*a* and verify voltage threshold 520*a*, the second guard band is the voltage range 530*b* between read voltage threshold 510*b* and verify voltage threshold 520*b*, and so on.

In various embodiments, the states may be different distances from adjacent states, and the guard bands 530*a-g* may have different widths or sizes. For example, in the depicted embodiment, the separation 530*a* between the L0 and L1 states is greater than the separation 530*b-g* between other adjacent states, and the guard band 530*a* between L0 and L1 is correspondingly wider. Also, in the depicted embodiment, the read voltage thresholds 510*b-g* are at the midpoint between the most likely voltages for adjacent states, but in another embodiment, the read voltage thresholds 510 may be lower, and closer to the edge of the distribution of cells for the lower states, thus widening the guard bands. It is clear in light of this disclosure that other arrangements of states, guard bands 530*a-g*, read voltage thresholds 510*a-g*, and verify voltage thresholds 520*a-g* are possible, and may be managed and adjusted by the guard band module 410 and/or the encoding module 414 to provide bits with distinct or varying levels of quality of service.

FIG. 5B depicts a table 550 illustrating one example encoding for the states L0-L7 of FIG. 5A. Because each cell in the depicted embodiment may be in one of eight different states, each cell encodes three different bits. The first bit is referred to as the most significant bit ("MSB"), the second bit is referred to as the central significant bit ("CSB"), and the third bit is referred to as the least significant bit ("LSB"). In the depicted embodiment, the encoding is a Gray code encoding, in which only one bit changes between adjacent states. In other embodiments, other encodings may be used.

In one embodiment, the level of quality of service for a bit of a cell is based on a number of transitions for the bit between adjacent states in an encoding of the cell. A transition 552 for a bit occurs between adjacent states if the value of the bit changes between those states. In the depicted encoding, it may be seen that the LSB has one transition 552, between the L3 and L4 states. The CSB has two transitions 552, between the L1 and L2 states and between the L5 and L6 states, and the MSB has four transitions 552. Because most errors occur between adjacent states, in certain embodiments, a bit experiences a higher risk of error in states near a transition 552 for that bit. Thus, because the LSB has one transition 552, in the depicted embodiment, the LSB provides a level of quality of service with a reliability level that is higher than provided by the CSB and the MSB. The CSB, with two transitions 552 in the depicted embodiment, provides a level of quality of service with a reliability level between the reliability levels provided by the LSB and the MSB. The MSB, with four transitions 552 in the depicted embodiment, provides a level of quality of service with a lower reliability level than those provided by the LSB and the CSB.

In another embodiment, the level of quality of service for a bit of a cell may be based on and/or correlated to a size of a guard band 530*a-g* between adjacent states with a transition 552 for the bit in an encoding of the cell. For example, in the depicted embodiment, the reliability level for the LSB may be increased by widening the guard band 530*d* at the transition 552 between the L3 and L4 states. Widening the guard band at one transition 552 may involve shifting the states and narrowing other guard bands, thus also affecting the reliability levels of other bits, such as the MSB and CSB.

Figure 6:
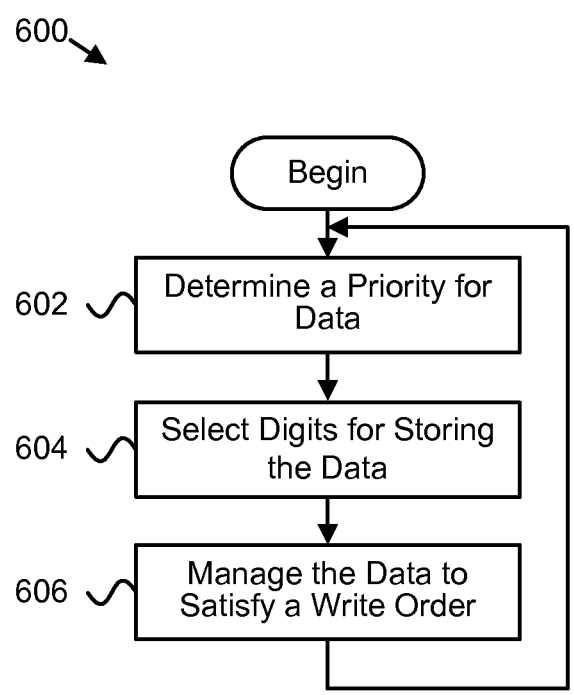
FIG. 6 is a schematic flow chart diagram illustrating one embodiment of a method for managing data reliability.

FIG. 6 depicts one embodiment of a method 600 for managing data reliability. The method 600 begins, and the priority module 302 receives 602 a storage request with a priority indicator for data of a non-volatile recording device 120 including a plurality of cells, where each cell includes a plurality of bits and the bits of a cell provide distinct levels of quality of service. The select module 304 selects 604 a bit for storing the data based on the priority of the data and the level of quality of service of the selected bit. The data management module 306 manages 606 the data to satisfy a write order for the plurality of bits. The priority module 302 continues to determine 602 priorities for additional data, and the method 600 continues.

Figure 7:
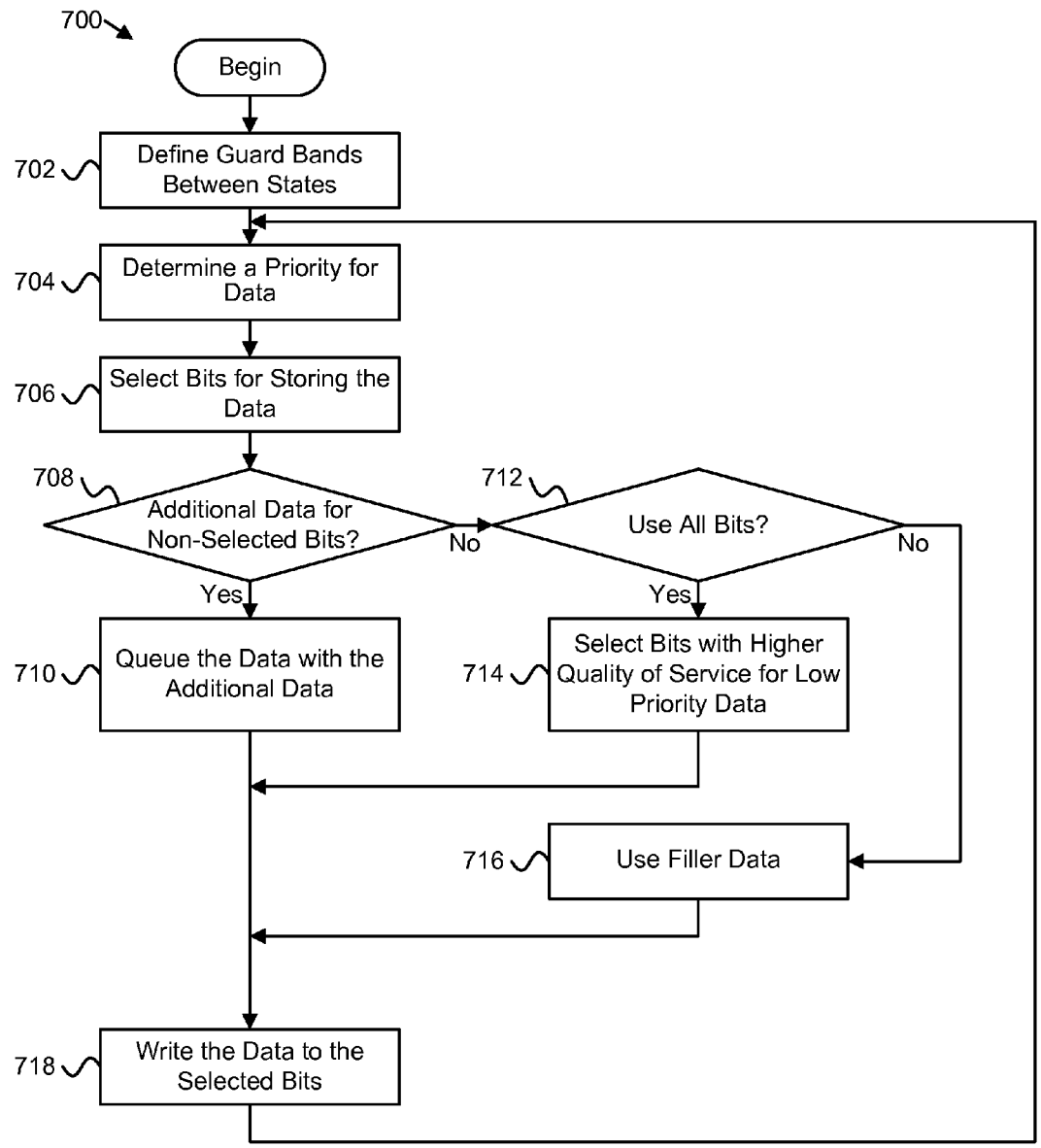
FIG. 7 is a schematic flow chart diagram illustrating another embodiment of a method for managing data reliability.

FIG. 7 depicts another embodiment of a method 700 for managing data reliability. The method 700 begins, and the guard band module 410 defines 702 guard bands between states in cells of a non-volatile memory device 120. The priority module 302 determines 704 a priority for data of a non-volatile recording device 120 including a plurality of cells, where each cell includes a plurality of bits and the bits of a cell provide distinct levels of quality of service. The select module 304 selects 706 one or more bits for storing the data based on the priority of the data and the level of quality of service of the one or more selected bits.

The data management module 306 determines 708 if additional data exists for writing or programming to non-selected bits. If additional data exists, the additional data module 402 queues 710 the data with the additional data for writing or programming to the non-volatile memory device 120 to satisfy the write order. Otherwise, the data management module 306 determines 712 if all the bits of a set of cells provide a level of quality of service sufficient for the priority of the data. If so, the low priority data module 406 selects 714 additional bits with a higher quality of service for storing low priority data, to satisfy the write order. Otherwise, the filler data module 404 uses 716 filler data to satisfy the write order. With the write order satisfied, the write module 408 writes 718 the data to the one or more selected bits. The priority module 302 continues to determine 704 priorities for additional data, and the method 700 continues.

Figure 8:
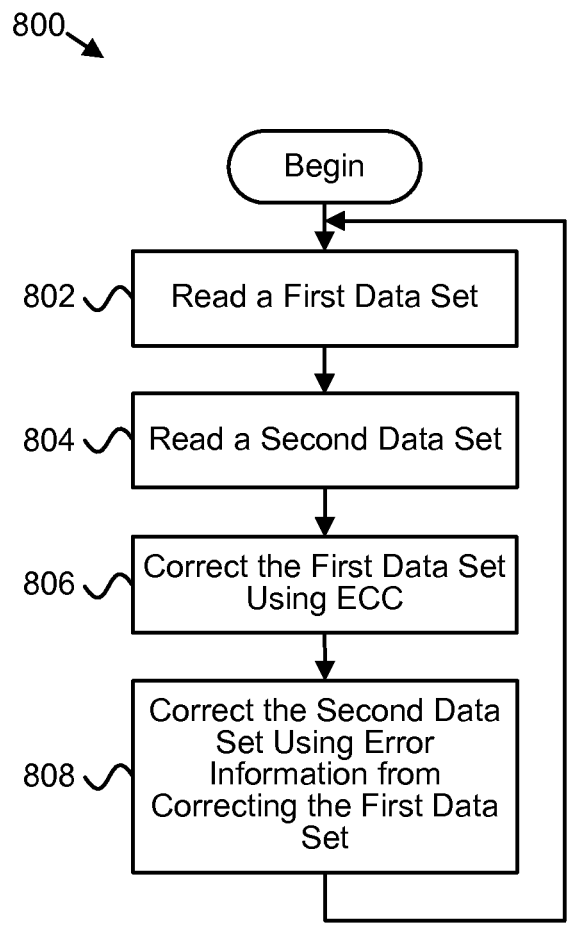
FIG. 8 is a schematic flow chart diagram illustrating a further embodiment of a method for managing data reliability.

FIG. 8 depicts a further embodiment of a method 800 for managing data reliability. The method 800 begins, and the ECC module 412 reads 802 a first data set comprising first bits of a set of cells of the plurality of cells, where the first bits provide a first level of quality of service. The ECC module 412 also reads 804 a second data set comprising second bits of the set of cells, where the second bits provide a second level of quality of service differing from the first level of quality of service. The ECC module 412 corrects 806 the first data set using an error correcting code. The ECC module 412 also corrects 808 the second data set at least partially using error information determined from correcting the first data set. The ECC module 412 continues to read 802 additional data sets, and the method 800 continues.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
   receiving a storage request for a non-volatile recording device, the storage request comprising data having a priority designation, the non-volatile recording device comprising a plurality of cells, each cell comprising a plurality of states and a transition guard band between first and second adjacent states, the plurality of states configured to represent values for a plurality of bits, the transition guard band configured such that bits for a cell provide distinct levels of quality of service;

selecting a bit for storing the data based on the priority designation of the data and the level of quality of service of the selected bit; and managing the data to satisfy a write order for the plurality of bits.

2. The method of claim 1, further comprising programming the data to the selected bit to provide a level of quality of service of the selected bit to the data.

3. The method of claim 1, further comprising configuring the transition guard band such that a first bit of a cell provides a first error rate and a second bit of the cell provides a second error rate, wherein the first error rate is less than the second error rate and the second error rate is within a maximum correctable error rate for the plurality of cells.

4. The method of claim 1, further comprising,
reading a first bit from the plurality of cells, the first bit providing a first level of quality of service; and
using error information from the first bit to read a second bit from the plurality of cells, the second bit providing a second level of quality of service differing from the first level of quality of service.

5. The method of claim 1, wherein managing the data comprises identifying additional data for programming to one or more non-selected bits, and queuing the data and the additional data for programming to the non-volatile recording device in the write order for the plurality of bits such that the data is stored in the one or more selected bit and the additional data is stored in the non-selected bits.

6. The method of claim 1, wherein managing the data comprises storing filler data to one or more non-selected bits in order to satisfy the write order for the plurality of bits.

7. The method of claim 1, wherein the selected bit provides a level of quality of service higher than indicated by the priority designation of the data, to satisfy the write order for the plurality of bits.

8. An apparatus comprising:
a priority module configured to receive a storage request for a non-volatile memory device, the storage request comprising data associated with a priority, the non-volatile memory device comprising a plurality of cells, each cell encoding a plurality of bits, the bits for a cell having different error rates;
a select module configured to select a bit for storing the data based on the priority of the data and the error rate of the selected bit; and
a data management module configured to queue write operations for programming the data in order to satisfy a write order for the plurality of bits,
wherein the priority module, the select module, and the data management module comprise one or more of a hardware device and executable code, the executable code stored on a non-transitory computer readable storage medium.

9. The apparatus of claim 8, further comprising a write module configured to program the data to the selected bit.

10. The apparatus of claim 8, further comprising an error correcting code ("ECC") module configured to use error information determined from a first data set to read a second data set, the first data set comprising first bits encoded by a set of cells of the plurality of cells, the second data set comprising second bits encoded by the set of cells.

11. The apparatus of claim 8, wherein the error rate for a bit of a cell correlates to a number of transitions for the bit in an encoding of the cell.

12. The apparatus of claim 8, wherein the error rate for a bit of a cell correlates to a size of a guard band between adjacent states with a transition for the bit in an encoding of the cell.

13. An apparatus comprising:
means for determining a priority for data of a non-volatile storage device, the non-volatile storage device comprising a plurality of cells, each cell encoding a plurality of bits, the bits for a cell providing distinct performance levels;
means for selecting a bit for storing the data based on the priority of the data and the performance level of the selected bit; and
means for programming the data to the selected bit to provide the performance level of the selected bit to the data,
wherein the means for determining the priority, the means for selecting the bit, and the means for programming the data comprise one or more of a hardware device and executable code, the executable code stored on a non-transitory computer readable storage medium.

14. The apparatus of claim 13, further comprising means for using error information determined from a first data set to read a second data set, the first data set comprising first bits encoded by a set of cells of the plurality of cells, the second data set comprising second bits encoded by the set of cells.

15. A system comprising:
a non-volatile recording device comprising a plurality of cells, each cell encoding a plurality of bits, the bits for a cell providing distinct levels of quality of service, the non-volatile recording device in communication with a host device over a communications bus;
a priority module configured to determine a priority for data of the non-volatile recording device;
a select module configured to select a bit for storing the data based on the priority of the data and the level of quality of service of the selected bit; and
an error correcting code ("ECC") module configured to use error information determined in response to reading the data from the selected bit to read additional data, the additional data stored by one or more non-selected bits.

16. The system of claim 15, wherein the priority for the data is determined based on a priority indicator received from a client.

17. The system of claim 16, wherein the priority indicator comprises a virtual storage unit selected by the client from a plurality of virtual storage units for storing the data.

18. The system of claim 17, wherein each virtual storage unit of the plurality of virtual storage units is associated with a different append point of a sequential log-based writing structure, the different append points associated with different bits of the plurality of cells.

19. The system of claim 15, further comprising determining the priority based on an access frequency for the data, the one or more selected bits providing a level of quality of service corresponding to the access frequency.

20. The system of claim 15, further comprising determining the priority based on a reliability level selected for the data, the one or more selected bits providing a level of quality of service satisfying the selected reliability level.

21. The system of claim 15, further comprising determining the priority based on a retention level selected for the data, the one or more selected bits providing a level of quality of service satisfying the selected retention level.

22. The system of claim 15, further comprising determining the priority based on a performance level selected for the data, the one or more selected bits providing a level of quality of service satisfying the selected performance level.

23. A computer program product comprising a non-transitory computer readable storage medium storing computer usable program code executable to perform operations, the operations comprising:

determining a priority for data of a non-volatile memory device, the non-volatile memory device comprising a plurality of cells, each cell encoding a plurality of bits, the bits for a cell providing distinct levels of quality of service, wherein the priority for the data is determined based on a virtual storage unit selected by a client from a plurality of virtual storage units for storing the data;

selecting a bit for storing the data based on the priority of the data and the level of quality of service of the selected bit; and programming the data to the selected bit to provide the level of quality of service of the selected bit to the data.

24. The computer program product of claim 23, wherein each virtual storage unit of the plurality of virtual storage units is associated with a different append point of a sequential log-based writing structure, the different append points associated with different bits of the plurality of cells.

* * * * *